United States Patent
Arai

(10) Patent No.: US 8,212,626 B2
(45) Date of Patent: Jul. 3, 2012

(54) CONSTANT-TEMPERATURE TYPE CRYSTAL OSCILLATOR

(75) Inventor: Junichi Arai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 31 days.

(21) Appl. No.: 12/721,130

(22) Filed: Mar. 10, 2010

(65) Prior Publication Data

US 2010/0231309 A1    Sep. 16, 2010

(30) Foreign Application Priority Data

Mar. 13, 2009   (JP) ................. 2009-060385

(51) Int. Cl.
*H03B 5/32*   (2006.01)
(52) U.S. Cl. .................. 331/158; 331/176; 331/116 R; 331/116 FE
(58) Field of Classification Search .............. 331/176, 331/68, 69, 158, 116 R
See application file for complete search history.

(56) References Cited

U.S. PATENT DOCUMENTS

| 7,382,204 B2 | 6/2008 | Arai et al. | |
| 2010/0073098 A1* | 3/2010 | Ito | 331/69 |

FOREIGN PATENT DOCUMENTS

| JP | 03-220905 A | 9/1991 |
| JP | 09-210802 A | 8/1997 |
| JP | 2006-278793 | 10/2006 |
| JP | 2006-311496 A | 11/2006 |

* cited by examiner

*Primary Examiner* — Arnold Kinkead

(74) *Attorney, Agent, or Firm* — Carrier Blackman & Associates, P.C.; Joseph P. Carrier; William D. Blackman

(57) ABSTRACT

A constant-temperature type crystal oscillator includes: a surface-mount crystal unit, in which a crystal element is housed in a case main body to hermetically encapsulate the crystal element with a metal cover, and which includes a crystal terminal serving as a mounting terminal that is electrically connected to at least the crystal element on an outer bottom face of the case main body; a thermistor that detects an operational temperature of the surface-mount crystal unit; and a circuit substrate, on which elements forming an oscillator circuit and elements forming a temperature control circuit along with the thermistor are installed. The thermistor includes a first and second terminal electrode and a temperature detecting electrode that is electrically independent of the first and second terminal electrode. The temperature detecting electrode is electrically connected to the crystal terminal of the surface-mount crystal unit through a circuit pattern formed on the circuit substrate.

12 Claims, 4 Drawing Sheets

20090101010101010101010101010101010101010101010101

CONSTANT-TEMPERATURE TYPE CRYSTAL OSCILLATOR

This application claims priority from Japanese Patent Application No. 2009-060385 filed on Mar. 13, 2009, the entire subject matter of which is incorporated herein by reference.

BACKGROUND OF THE INVENTION

1. Field of the Invention

The present invention relates to a technical field of a crystal oscillator of a constant-temperature type (hereinafter called a constant-temperature type oscillator), and in particular, to a constant-temperature type oscillator that detects an operational temperature of a crystal unit in real time.

2. Description of the Related Art

Constant-temperature type oscillators keep the operational temperatures of their crystal units constant. For example, the constant-temperature type oscillators can obtain a highly-stable oscillating frequency of 0.1 ppm or less or on the order of 1 ppb without causing frequency changes dependent on the frequency temperature characteristics. Therefore, the constant-temperature type oscillators are applied to base stations of communication facilities.

FIGS. 2A and 2B are diagrams for explanation of one example of a related-art constant-temperature type oscillator, in which FIG. 2A is a cross-sectional view thereof, and FIG. 2B is a schematic circuit diagram thereof.

The constant-temperature type oscillator shown in FIGS. 2A and 2B includes an oscillator circuit 1 and a temperature control circuit 2, and respective elements forming the oscillator circuit 1 and the temperature control circuit 2 are installed on a circuit substrate 4. The circuit substrate 4 is held by lead wires 6 projecting on the surface of a metal base 5, for example, and a metal cover 7 is bonded thereon by resistance welding. The oscillator circuit 1 is composed of a surface-mount crystal unit 3A, and a capacitor and an oscillating amplifier of an oscillating part. The oscillator circuit 1 is formed as a Colpitts type circuit with the surface-mount crystal unit 3A serving as an inductance component.

FIGS. 3A to 3C are diagrams for explanation of a related art surface-mount crystal unit, in which FIG. 3A is a cross-sectional view thereof, FIG. 3B is a bottom view thereof, and FIG. 3C is a plan view of a crystal element thereof.

As shown in the FIG. 3A, the surface-mount crystal unit 3A is configured so that a crystal element 9 formed as, for example, an AT-cut crystal element or an SC-cut crystal element is housed in a case main body 8 made of laminar ceramics, which is formed to be concave, and a metal cover 10 is bonded to hermetically encapsulate the crystal element 9. As shown in FIG. 3B, the case main body 8 includes mounting terminals 11 on an outer bottom face thereof that includes crystal terminals 11a on a set of diagonal corners, and ground terminals 11b on the other set of diagonal corners.

As shown in FIG. 3C, leading electrodes 17a, 17b and excitation electrodes 16a, 16b are formed on the crystal element 9. Both sides of one end of the leading electrodes 17a, 17b extending from excitation electrodes 16a, 16b of the crystal element 9 are firmly fixed to a crystal holding terminal 13 with an electrically conductive adhesive 12. Then, the crystal element 9 is electrically connected to the crystal terminals 11a on the outer bottom face of the case main body 8 through wiring paths including end face electrodes on the outer side face (not shown). The metal cover 10 is bonded to a metal ring 18 on an opening end face of the case main body 8 by seam welding, for example, and the metal cover 10 is electrically connected to the ground terminals 11b on the outer bottom face of the case main body 8 through wiring paths including through electrodes on the frame wall (not shown).

In the temperature control circuit 2, a detecting voltage by a thermistor 3Rth which resistance value changes according to an operational temperature of the surface-mount crystal unit 3A and a fixed resistor 3Ra and a reference voltage by fixed resistors 3Rb and 3Rc are applied to an input of an operational amplifier 30A to obtain a comparison voltage. The comparison voltage controls an output of a power transistor 3Tr, which supplies electric power to a heating resistor 3Rh that is composed of a chip resistor. Thereby, an operational temperature of the surface-mount crystal unit 3A is kept constant.

In a constant-temperature type oscillator having such a structure, the surface-mount crystal unit 3A, the heating resistor 3Rh, the thermistor 3Rth and the power transistor 3Tr are installed on a under surface of the circuit substrate 4 facing the metal base 5. These respective elements 3 are covered with heat conducting resin 14. Thereby, the surface-mount crystal unit 3A, the heating resistor 3Rh, the thermistor 3Rth and the power transistor 3Tr are thermally coupled.

FIGS. 4A and 4B are diagrams for explanation of another example of a related art constant-temperature type oscillator, in which FIG. 4A is a diagram of a partial wiring pattern of a circuit substrate thereof, and FIG. 4B is a diagram of a thermistor thereof. As shown in FIGS. 4A and 4B, a thermistor circuit terminal 15A, to which the first terminal electrode 15a of first and second terminal electrodes 15a, 15b provided on both end sides of the thermistor 3Rth is connected, is connected to crystal unit circuit terminals 11B, to which the ground terminals 11b of the surface-mount crystal unit 3A are connected. Thereby, an operational temperature of the surface-mount crystal unit 3A is directly detected. The respective elements 3 of the oscillator circuit 1 and the temperature control circuit 2 other than the surface-mount crystal unit 3A, the heating resistor 3Rh, the thermistor 3Rth and the power transistor 3Tr are installed on the top surface of the circuit substrate 4.

Incidentally, JP-A-2006-311496 and JP-A-2006-278793 each discloses a related art.

However, in a constant-temperature type oscillator having the above-described configuration, the ground terminals 11b of the surface-mount crystal unit 3A, to which the one end of the thermistor 3Rth is connected, involves no electrical connections to the crystal element 9. Thus, in a strict sense, the thermistor 3Rth is not in direct thermal contact with the crystal element 9. Accordingly, there has been a problem that, even if the one end of the thermistor 3Rth is electrically connected to the ground terminals 11b, it is not necessarily possible to directly detect an operational temperature of the crystal unit, i.e., an operational temperature of the crystal element 9.

Further, because the one end of the thermistor 3Rth is connected to the ground terminal 11b of the surface-mount crystal unit 3A, the ground terminal 11b is provided with an electric potential on the one end side of the thermistor 3Rth. Accordingly, there has been a problem that, at the time of loading the constant-temperature type oscillator on a set substrate, the ground terminals 11b cannot be connected to the ground pattern of the set substrate, which makes it impossible to ground the metal cover 10 of the surface-mount crystal unit 3A.

SUMMARY OF THE INVENTION

An object of the present invention is first to directly detect an operational temperature of a surface-mount crystal unit and is secondly to provide a constant-temperature type oscillator in which a metal cover is grounded to the ground potential.

The present invention has been achieved by focusing attention on the thermistor shown in JP-A-2006-278793. That is, the present invention has been achieved by focusing attention on the thermistor which not only has the first and second terminal electrodes, but also a third terminal electrode electrically independent of those.

According to a first aspect of the invention, there is provided a constant-temperature type crystal oscillator comprising: a surface-mount crystal unit, in which a crystal element is housed in a case main body to hermetically encapsulate the crystal element with a metal cover, and which comprises a crystal terminal serving as a mounting terminal that is electrically connected to at least the crystal element on an outer bottom face of the case main body; a thermistor that detects an operational temperature of the surface-mount crystal unit; and a circuit substrate, on which elements forming an oscillator circuit along with the surface-mount crystal unit and elements forming a temperature control circuit along with the thermistor are installed, wherein the thermistor comprises: a first terminal electrode; a second terminal electrode; and a temperature detecting electrode that is electrically independent of the first terminal electrode and the second terminal electrode, and wherein the temperature detecting electrode is electrically connected to the crystal terminal of the surface-mount crystal unit through a circuit pattern formed on the circuit substrate.

According to a second aspect of the invention, in the constant-temperature type crystal oscillator, wherein the case main body comprises ground terminals serving as mounting terminals on the outer bottom face thereof, and wherein the ground terminals are electrically connected to the metal cover.

According to the aspects of the invention, the crystal terminals on the outer bottom face of the surface-mount crystal unit and the temperature detecting electrode of the thermistor are electrically connected through the circuit pattern. Accordingly, the temperature detecting electrode of the thermistor is electrically connected directly to the crystal element (particularly the excitation electrodes) via the crystal terminals on the outer bottom face. Thereby, it is possible to directly detect an operational temperature of the surface-mount crystal unit more than the case in which the thermistor is connected to the ground terminals in the related art.

In addition, according to the second aspect, it is possible not only to directly detect an operational temperature of the surface-mount crystal unit, that is the effect of the first aspect, but also to ground the ground terminals to the ground pattern.

BRIEF DESCRIPTION OF THE DRAWINGS

FIGS. 1A and 1B are diagrams for explanation of a constant-temperature type oscillator according to an embodiment of the present invention, in which FIG. 1A is a diagram of a partial wiring pattern of a circuit substrate of the constant-temperature type oscillator, and FIG. 1B is a diagram of a thermistor of the constant-temperature type oscillator;

FIGS. 2A and 2B are diagrams for explanation of one example of a related art constant-temperature type oscillator, in which FIG. 2A is a cross-sectional view thereof, and FIG. 2B is a schematic circuit diagram thereof;

FIGS. 3A to 3C are diagrams for explanation of one example of a related art surface-mount crystal unit, in which FIG. 3A is a cross-sectional view thereof, FIG. 3B is a bottom view thereof, and FIG. 3C is a plan view of a crystal element thereof; and FIGS. 4A and 4B are diagrams for explanation of another example of a related art constant-temperature type oscillator, in which FIG. 4A is a diagram of a partial wiring pattern of a circuit substrate thereof, and FIG. 4B is a diagram of a thermistor thereof.

DETAILED DESCRIPTION OF THE PREFERRED EMBODIMENTS

Figure 1A:
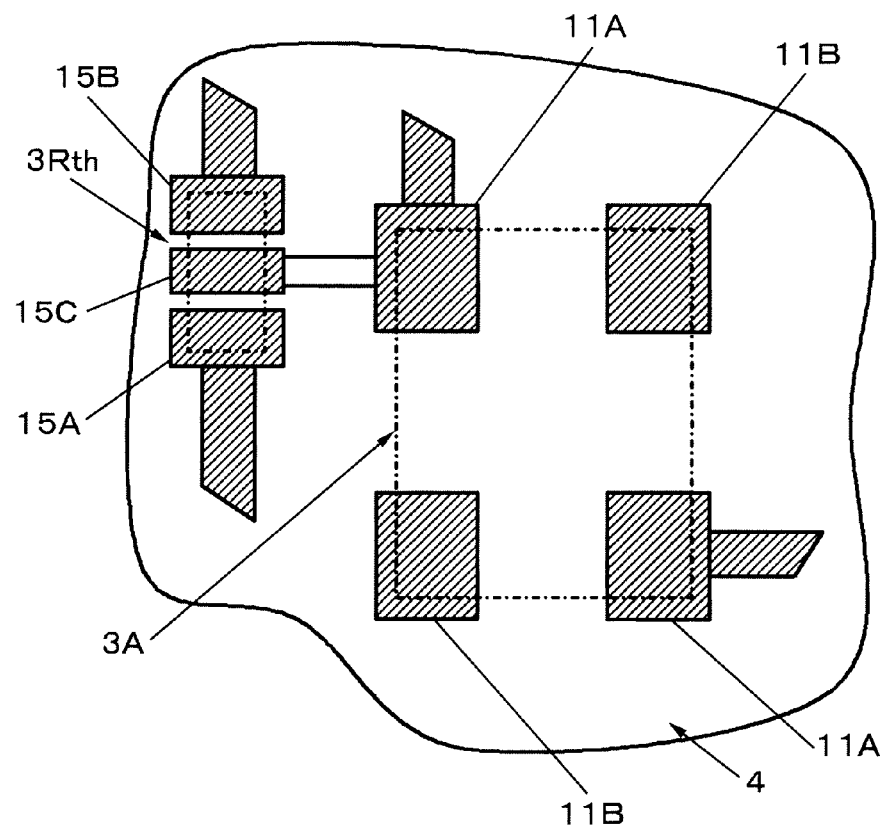
Figure 1B:
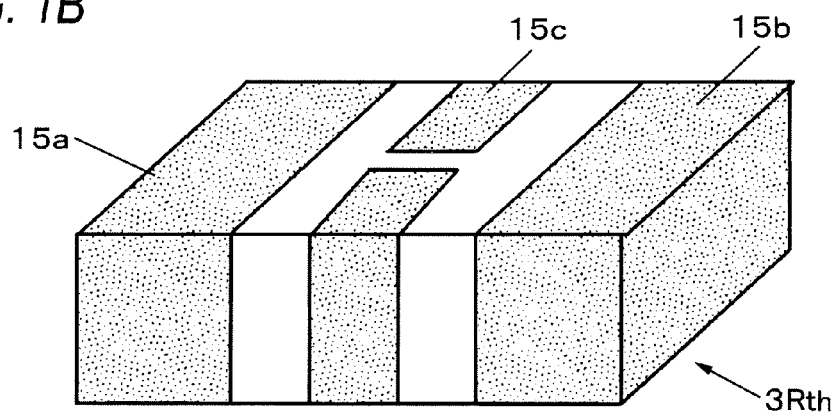

Hereinafter, an embodiment of the present invention will be described with reference to the drawings. FIGS. 1A and 1B are diagrams of a partial wiring pattern of a circuit substrate and a thermistor of a constant-temperature type oscillator according to the embodiment of the invention. In addition, portions which are the same as those in the related art are denoted by the same numbers, and descriptions thereof will be simplified or omitted.

Figure 2A:
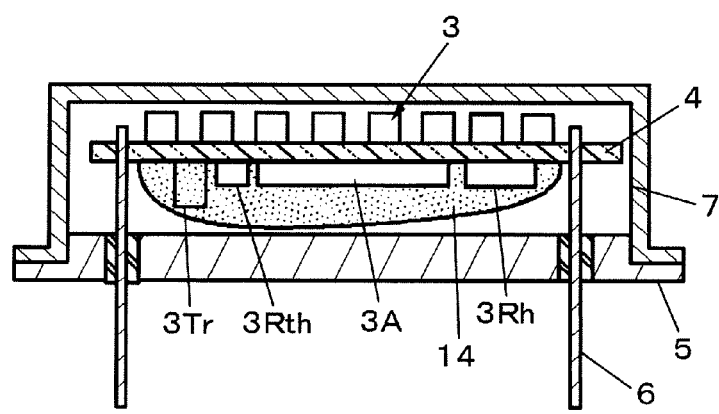
Figure 2B:
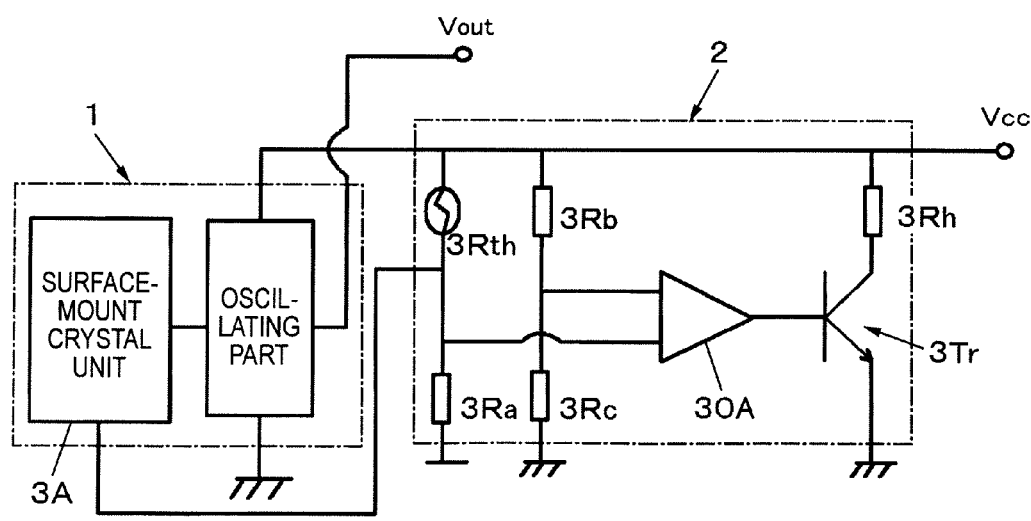
Figure 3A:
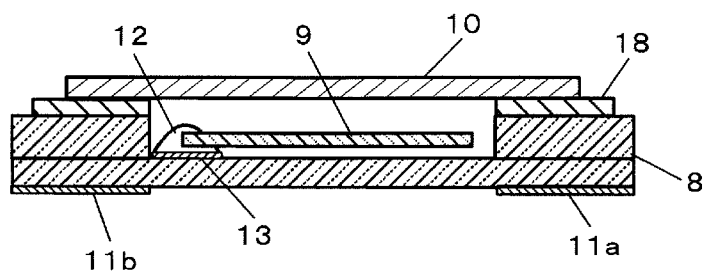
Figure 3B:
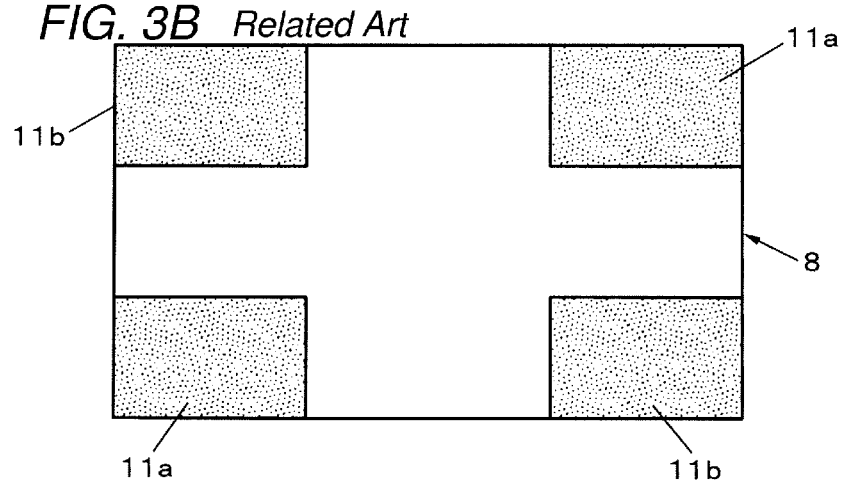
Figure 3C:
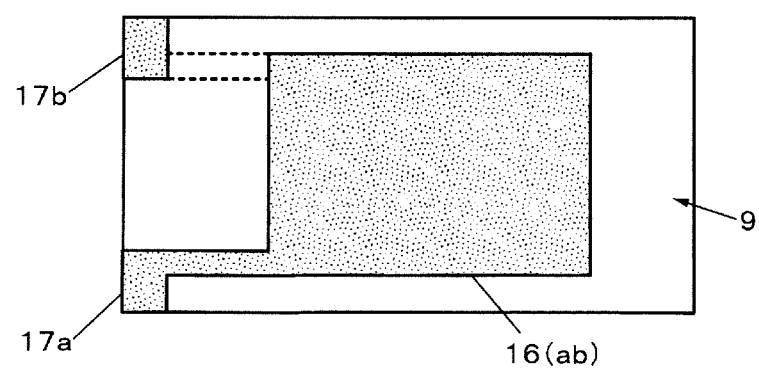
Figure 4A:
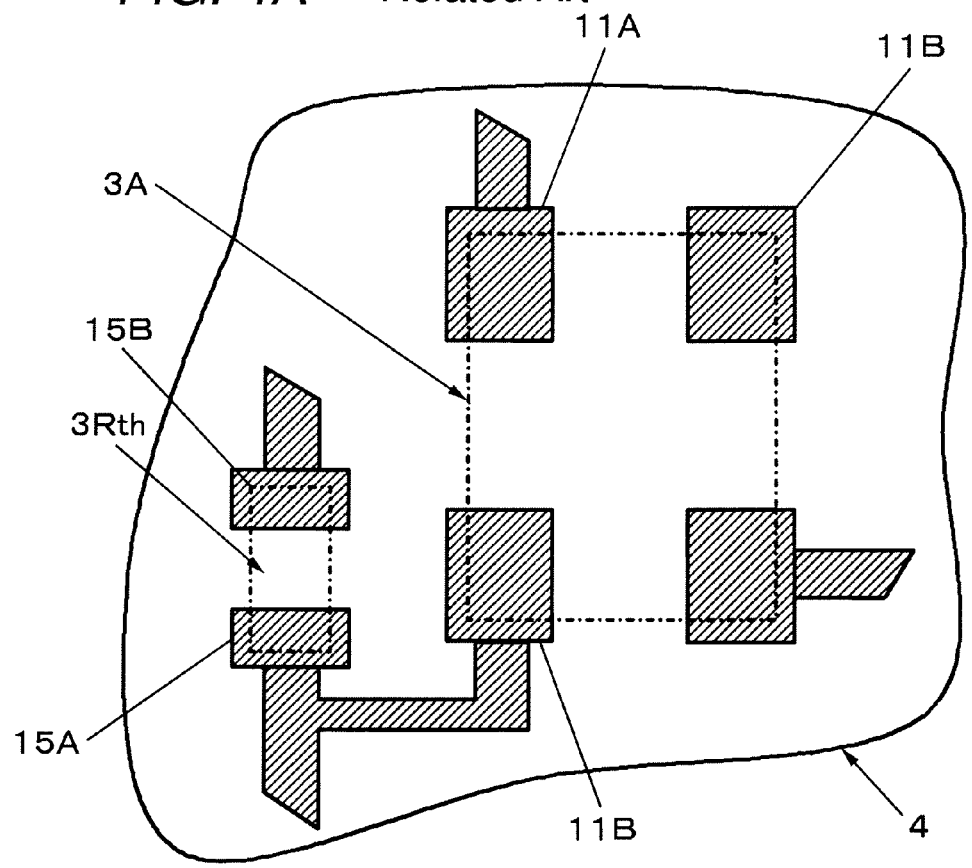
Figure 4B:
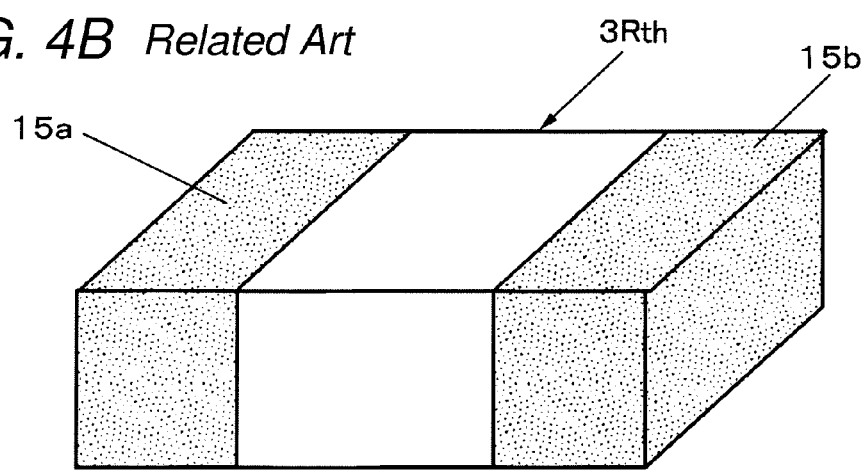

The constant-temperature type oscillator is composed of the oscillator circuit 1, which includes the surface-mounted crystal unit 3A, and the temperature control circuit 2, which keeps an operational temperature of the surface-mount crystal unit 3A constant. The surface-mount crystal unit 3A includes the crystal terminals 11a and the ground terminals 11b on the outer bottom face of the case main body 8 and is formed by hermetically encapsulating the crystal element 9 with the metal cover 10. Then, the constant-temperature type oscillator is configured so that the respective elements 3 composing the oscillator circuit 1 and the temperature control circuit 2 are installed on the circuit substrate 4, and the metal cover 7 is bonded thereon so as to hold the circuit substrate 4 on the metal base 5 (refer to FIG. 2).

The temperature control circuit 2 includes at least the heating resistor 3Rh, the power transistor 3Tr and the thermistor 3Rth. The temperature control circuit 2 is installed on the under surface of the circuit substrate 4. The thermistor 3Rth includes the first and second terminal electrodes 15a, 15b on both end sides thereof. The thermistor 3Rth includes a temperature detecting electrode 15c on a central area electrically independent of those. Then, the thermistor 3Rth is installed so as to be adjacent to the surface-mount crystal unit 3A.

The circuit substrate 4 includes crystal unit circuit terminals 11A, 11B and thermistor circuit terminals 15A, 15B, 15C. The mounting terminals 11 (the crystal terminals 11a and the ground terminals 11b) of the surface-mount crystal unit 3A are firmly fixed to the crystal unit circuit terminals 11A, 11B. The terminal electrodes 15a, 15b and the temperature detecting electrode 15c of the thermistor 3Rth are firmly fixed to the thermistor circuit terminals 15A, 15B, 15C. The crystal unit circuit terminals 11A, 11B correspond to the mounting terminals 11a, 11b of the surface-mount crystal unit 3A. That is, a set of diagonal corners serve as the crystal unit circuit terminals 11A to which the crystal terminals 11a are firmly fixed, and the other set of diagonal corners serve as the crystal unit circuit terminals 11B to which the ground terminals 11b are firmly fixed.

The thermistor circuit terminals 15A, 15B, 15C are formed so as to be adjacent to the crystal unit circuit terminal 11A, to which the crystal terminal 11a of one of the surface-mount crystal unit 3A is firmly fixed. Then, the thermistor circuit terminal 15C, to which the temperature detecting electrode 15c is firmly fixed, is electrically connected to the crystal unit circuit terminal 11A, to which the crystal terminal 11a is firmly fixed, through the wiring pattern.

With such a configuration, the temperature detecting electrode 15c of the thermistor is electrically connected to the crystal terminal 11a on the outer bottom face of the surface-mount crystal unit 3A (case main body 8) through the wiring pattern. In this case, the crystal terminal 11a on the outer bottom face is electrically connected to the leading electrodes 17a, 17b and the excitation electrodes 16a, 16b of the crystal element 9 via the wiring paths and the crystal holding terminal 13 in the case main body 8. Accordingly, the thermistor 3Rth is capable of directly detecting a temperature of the excitation electrode portion of the crystal element 9, which is an operational temperature of the surface-mount crystal unit, via the wiring paths with high thermal conductivity.

Then, because the ground terminals electrically connected to the metal cover 10 hermetically sealing up the opening end face of the case main body 8 involve no electrical connections to the thermistor 3Rth as in the related art, the ground terminals 11b can be grounded to the ground pattern of the set substrate.

In the above-described embodiment, the temperature detecting electrode 15c of the thermistor 3Rth is connected to one of the crystal terminals 11a serving as a mounting terminal. Alternatively, the temperature detecting electrode 15c of the thermistor 3Rth may be connected in common to the other crystal terminal 11a. In this case, the surface-mount crystal unit is operated with a resistance value of a higher temperature detected by one of the crystal terminals 11a.

Further, two thermistors 3Rth independent of each other may be installed to, not only one of the crystal terminals 11a, but also both crystal terminals 11a, and the temperature detecting electrode 15c may be electrically connected thereto. In this case, the thermistors 3Rth are connected directly or in parallel, and an average value of detected temperatures from both crystal terminals 11a can be obtained.

What is claimed is:

1. A constant-temperature type crystal oscillator comprising:
    a surface-mount crystal unit, in which a crystal element is housed in a case main body to hermetically encapsulate the crystal element with a metal cover, and which comprises a crystal terminal serving as a mounting terminal that is electrically connected to at least the crystal element on an outer bottom face of the case main body;
    a thermistor that detects an operational temperature of the surface-mount crystal unit; and
    a circuit substrate, on which elements forming an oscillator circuit along with the surface-mount crystal unit and elements forming a temperature control circuit along with the thermistor are installed,
    wherein the thermistor comprises:
        a first terminal electrode;
        a second terminal electrode; and
        a temperature detecting electrode that is electrically independent of the first terminal electrode and the second terminal electrode, and
    wherein the temperature detecting electrode is electrically connected to the crystal terminal of the surface-mount crystal unit through a circuit pattern formed on the circuit substrate.

2. The constant-temperature type crystal oscillator according to claim 1,
    wherein the surface-mount crystal unit further comprises ground terminals serving as mounting terminals on the outer bottom face of the case main body and wherein the ground terminals are electrically connected to the metal cover.

3. The constant-temperature type crystal oscillator according to claim 1,
    wherein the thermistor and crystal unit are mounted to the circuit substrate such that the electrodes of the thermistor are adjacent to the crystal terminal of the crystal unit.

4. The constant-temperature type crystal oscillator according to claim 1,
    wherein the circuit substrate includes at least one thermistor circuit terminal, and the temperature detecting electrode is firmly fixed to the thermistor circuit terminal.

5. The constant-temperature type crystal oscillator according to claim 4,
    wherein the thermistor circuit terminal is directly electrically connected to the crystal terminal of the surface-mount crystal unit through the circuit pattern formed on the circuit substrate.

6. The constant-temperature type crystal oscillator according to claim 1, wherein the circuit pattern formed on the circuit substrate also thermally connects the temperature detecting electrode to the crystal terminal of the surface-mount crystal unit.

7. The constant-temperature type crystal oscillator according to claim 2,
    wherein the circuit pattern formed on the circuit substrate also directly thermally connects the temperature detecting electrode of the thermistor to the crystal terminal of the surface-mount crystal unit, which is electrically connected to at least the crystal element, so that the thermistor is configured to directly detect the operational temperature of the surface-mount crystal unit.

8. The constant-temperature type crystal oscillator according to claim 2,
    wherein the thermistor is electrically independent of the ground terminals of the surface-mount crystal unit, which are electrically connected to the metal cover.

9. The constant-temperature type crystal oscillator according to claim 8,
    wherein the metal cover is configured to be grounded to a ground potential.

10. The constant-temperature type crystal oscillator according to claim 1,
    wherein:
        the first terminal electrode and the second terminal electrode are disposed at both end sides of the thermistor; and
        the temperature detecting electrode is disposed at a central area of the thermistor between the first and second terminal electrodes.

11. The constant-temperature type crystal oscillator according to claim 10,
    wherein the first terminal electrode, the second terminal electrode and the temperature detecting electrode of the thermistor are electrically independent of the ground terminals of the surface-mount crystal unit, which are electrically connected to the metal cover.

12. The constant-temperature type crystal oscillator according to claim 11,
    wherein the metal cover is configured to be grounded to a ground potential.

* * * * *